United States Patent [19]

Smith

[11] Patent Number: 5,099,149
[45] Date of Patent: Mar. 24, 1992

[54] PROGRAMMABLE INTEGRATED CIRCUIT

[75] Inventor: Bill W. Smith, Emmaus, Pa.

[73] Assignee: AT&T Bell Laboratories, Murray Hill, N.J.

[21] Appl. No.: 630,123

[22] Filed: Dec. 19, 1990

[51] Int. Cl.⁵ .......................................... H03K 19/177
[52] U.S. Cl. .................... 307/465; 307/202.1; 307/468
[58] Field of Search ................. 307/202.1, 443, 448, 307/465, 468, 469

[56] References Cited

U.S. PATENT DOCUMENTS

| | | | |
|---|---|---|---|
| 4,721,868 | 1/1988 | Cornell et al. | 307/202.1 X |
| 4,874,968 | 10/1989 | Brackmann | 307/468 X |
| 4,886,432 | 9/1989 | Goetting | 307/465 X |
| 4,910,418 | 3/1990 | Graham et al. | 307/202.1 X |
| 4,952,824 | 8/1990 | Kamuro | 307/465 X |

*Primary Examiner*—David Hudspeth
*Attorney, Agent, or Firm*—Richard D. Laumann

[57] ABSTRACT

A programmable circuit uses antifuse to program the circuit with the antifuses located not in the logic path but located so they control the voltage applied to the gate electrode of a transistor located in the logic path.

4 Claims, 2 Drawing Sheets

PROGRAMMABLE INTEGRATED CIRCUIT

TECHNICAL FIELD

This invention relates to programmable integrated circuits and to the technique used to program the circuit.

BACKGROUND OF THE INVENTION

Although most integrated circuits today are general purpose circuits, such as memories, processors, etc., special purpose integrated circuits are frequently needed for particular applications. Severel techniques have been developed to make such circuits. One technique makes a complete set of masks for the lithographic patterning necessary to make the circuit, i.e., it follows the techniques used for the general purpose circuits. This technique is used to make what are commonly referred to as application specific integrated circuits. These circuits are usually referred to by the acronym ASIC. Such circuits are advantageously employed in many diverse applications.

While ASICs are perfectly adequate for many applications, their manufacture requires the fabrication of a complete mask set which frequently involves substantial expense. Additionally, the manufacturing process may require substantial time. These factors are frequently not important when many integrated circuits are fabricated. However, other techniques which are either cheaper or quicker than the technique described for ASICs are desirable for circuits that are made in relatively small numbers or which must be made rapidly. One such technique makes what are referred to as field programmable circuits. Such circuits may be either logic arrays or gate arrays and are frequently referred to by the acronyms FPLA and FPGA, respectively.

These circuits are customized for their particular uses by selectively closing electrical paths in the circuit, i.e., by programming the circuit. The element used to close the electrical circuit is termed an antifuse and it is an element that changes from a high resistance OFF state to a low ON state upon application of an appropriate electric voltage. In the usual circuit, the antifuses are located directly in the memory or logic circuit. That is, the antifuse may constitute the memory element or it may be used to selectively connect various devices. This technique for programming the circuit is simple and straightforward. Programming circuits, including two high voltage transistors, are required for each bit in addition to the single antifuse. High voltage in this context means a voltage significantly higher than the 5 volts commonly used in integrated circuits.

There are, however, drawbacks to including the antifuse directly in the logic or memory circuit, as described. For example, significant chip area is required for the two high voltage transistors needed for each bit. Additionally, the antifuse ON state resistance is a critical circuit parameter and may be either too high or not easily controlled.

SUMMARY OF THE INVENTION

A programmable integrated circuit comprising first and second pluralities of transistors, each having gate, source, and drain electrodes; column and row address select switches; said gates of said first and second pluralities being connected to said column and row address select switches, respectively; a plurality of programmable circuits, each circuit being connected to the source/drain of one transistor of said first plurality and of one transistor of said second plurality; each circuit comprising a transistor having gate, source and drain electrodes, first and second programmable elements connected in series; said gate electrode being connected to the common connection of said first and second programmable elements, and, said source and drain electrodes being connected to the logic path. The first and second programmable elements are connected to the source/drain electrodes of transistors of said first and second pluralities, respectively. The logic paths run through the programmable elements. In a preferred embodiment, the progammable elements are antifuses. In a further preferred embodiment, the circuit further comprises a resistor connected between the gate and drain of said transistor.

DETAILED DESCRIPTION

Figure 1:
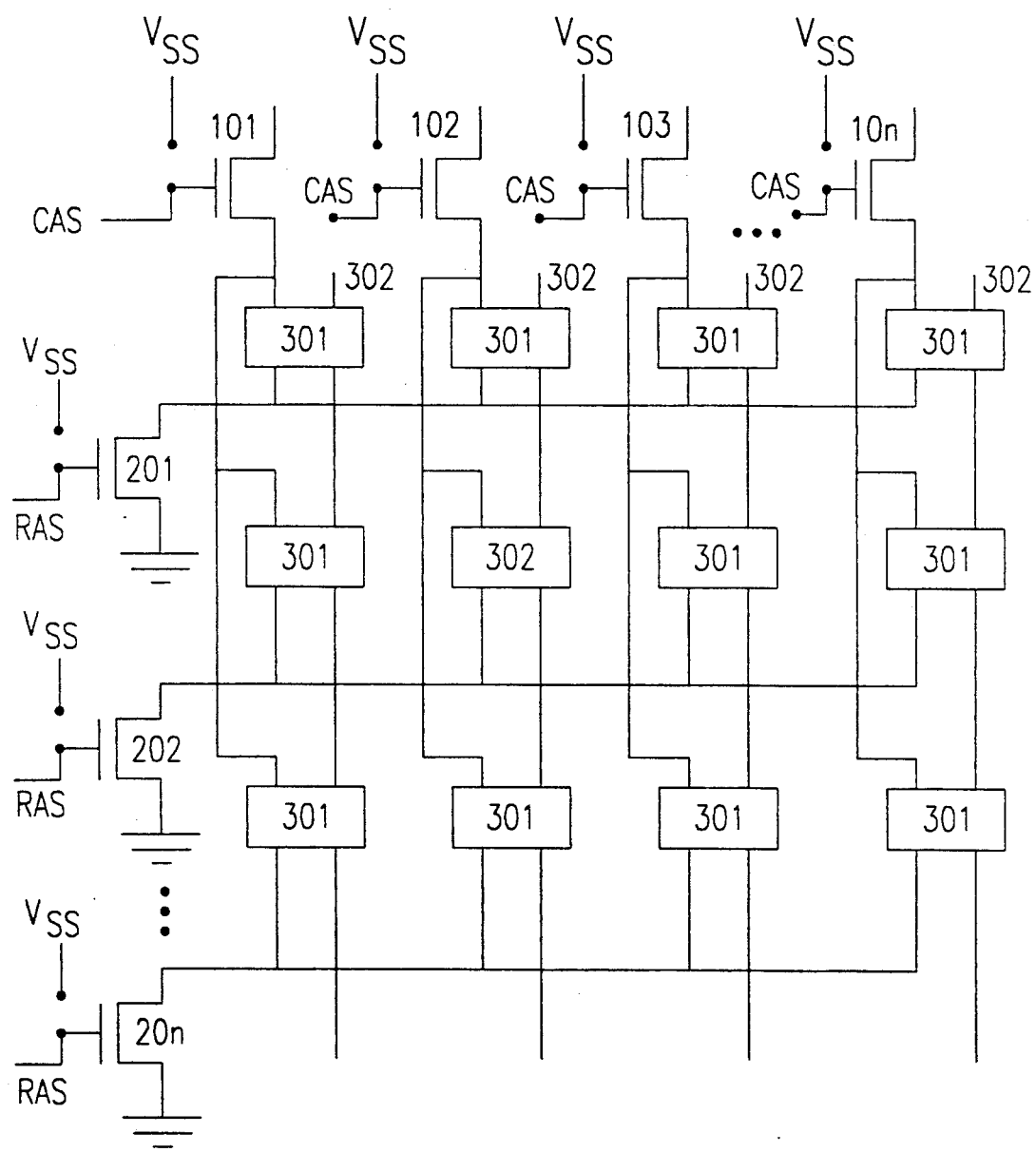
FIG. 1 is a schematic representation of a field programmable circuit according to this invention.

FIG. 1 is a schematic representation of one embodiment of a programmable array according to this invention. Depicted are a first plurality of transistors, 101, 102, 103, ..., 10n, and a second plurality of transistors 201, 202, ..., 20n. Each transistor has gate, source, and drain electrodes. The first and second pluralities are used to select the columns and rows; i.e., the gates of the first and second pluralities are connected to column and row address switches, respectively. For each bit, there is a programmable circuit 301 which will be described in detail with respect to FIG. 2. Logic paths 302 run through the programmable circuits 301. Each programmable circuit represents a bit, and each circuit is connected to the source/drain electrode of both a row and a column transistor.

Figure 2:
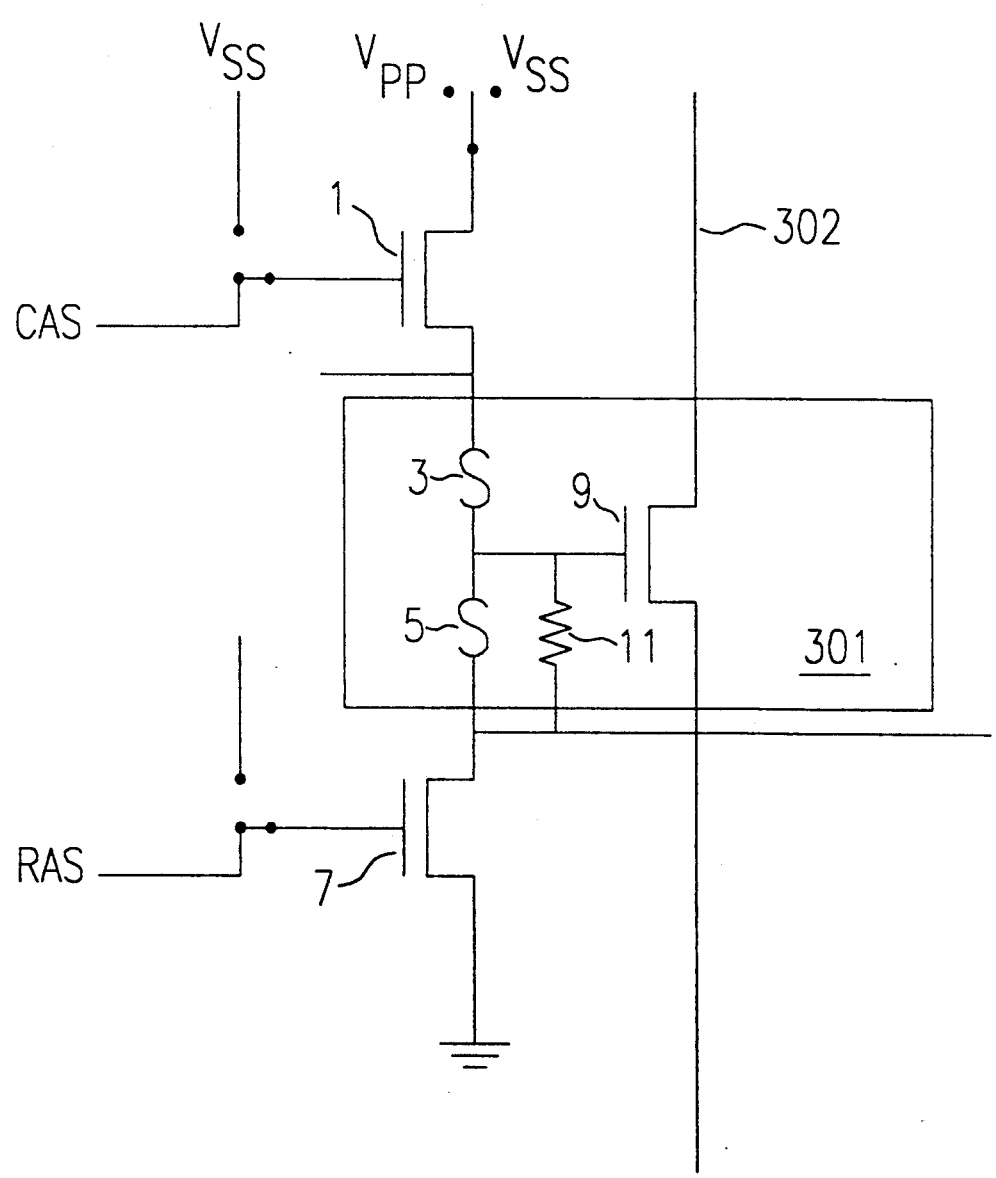
FIG. 2 is a schematic representation of the antifuse programming circuit for an integrated circuit according to this invention.

FIG. 2 schematically depicts an exemplary embodiment of a progammable circuit according to this invention for a single bit location. In addition to the elements described with respect to FIG. 1, the element depicted include the elements of circuit 301. The elements of the circuit depicted include a series circuit of first progammable element 3 and second programmable element 5, which have a common connection and are connected to the source/drain electrodes of transistors of the first and second pluralities, respectively. In the embodiment depicted, the programmable elements comprise antifuses. First plurality transistor 1 has its drain/source connected to either $V_{pp}$ or $V_{ss}$ and second plurality transistor 7 has its source/drain connected to ground. The gate electrodes of the transistors of the first and second pluralities are connected to $V_{ss}$ when programming is not being performed. The circuits also includes third transistor 9 and the logic path is through this transistor which has its gate electrode connected to the common connection of first and second antifuses 3 and 5. A load resistor 11 is connected to the gate and drain electrode of the third transistor. The third transistor, having source and drain electrodes connected to the logic path, is the only element depicted in the logic path.

Programming of the antifuse is easily accomplished. The source of the first transistor is taken to the programming voltage $V_{pp}$. This is typically between 10 and 20 volts, although the precise value will depend upon the antifuse structure. The desired bit is selected by selecting the addresses of both the desired row and column, i.e., the row address select and the column address select are taken to a positive voltage, $V_{ss}$. This applies a voltage to the gates of the first and second transistors which turns them ON, i.e., a voltage is established across the elements of the series cicuit and both antifuses are programmed. The antifuse will have resistances typically in the range of thousands of ohms after programming.

The gates of the transistor of the first and second pluralities, as well as the source of the first transistor, are now connected directly to $V_{ss}$. These transistors are now ON and the first and second antifuses function as a voltage divider and apply a voltage to the gate of the third transistor which turns it ON. If the antifuses have not been programmed, the load resistor applies a voltage which is close to ground to the gate of the third transistor. This is desirable because it reduces the probability of noise turning ON the third transistor. The value of the load resistor is selected to reduce the current drain of the programmed bit.

The details of the antifuses need not be described as they are well known to those skilled in the art. For example, high resistivity amorphous silicon adjacent a layer of, e.g., Ti:W, or layers of Ti:W and Ti may be used in the antifuses. A sufficiently high voltage renders the antifuse conducting. It is hypothesized that silicide regions are formed. Those skilled in the art will readily fabricate the antifuses and the circuitry depicted and described.

The circuit depicted has several advantages over the circuit previously described with respect to the prior art. The approach of this invention uses the antifuses to establish a voltage on the gate of the third transistor with a very high resistance. This reduces the current drain. Accordingly, only a relatively low current is required to program the bits. The high voltage needed for programming is seen by only the first transistor while the second transistor has a normal breakdown.

The chip area required for the second transistor is reduced because a high resistance is typically achieved with a large area. As will be readily appreciated by those skilled in the art, an even more significant reduction in chip area is achieved because the programming transistors, i.e., the first and second transistors, are needed only for each row and for each column and not for each bit.

Variations in the embodiment described are contemplated. For example, the programmable elements could comprise fuses.

I claim:

1. A programmable integrated circuit comprising first and second pluralities of transistors, each having gate, source and drain electrodes;

column and row address select switches, said gates of said first and said second pluralities being connected to said column and row address select switches, respectively;

a plurality of programmable circuits, each circuit being connected to the source/drain of one transistor of said first plurality of one transistor and of one transistor of one transistor of said second plurality;

each circuit comprising a transistor having gate, source and drain electrodes, first and second programmable elements connected in series, said gate electrode being connected to the common connection of said first and second programmable elements, and said source and drain electrodes being connected to the logic path.

2. A programmable integrated circuit as recited in claim 1 in which said programmable elements comprises antifuses.

3. A programmable integrated circuit as recited in claim 2 further comprising a resistor connected between said gate and drain electrodes of said transistor.

4. A programmable integrated circuit as recited in claim 2 further comprising a plurality of logic paths running through said transistors and being connected to said source and drain electrodes of said transistors.

* * * * *